United States Patent
Stella et al.

(10) Patent No.: US 9,202,766 B2
(45) Date of Patent: Dec. 1, 2015

(54) PACKAGE FOR POWER DEVICE AND METHOD OF MAKING THE SAME

(71) Applicant: STMicroelectronics S.r.l., Agrate Brianza (IT)

(72) Inventors: Cristiano Gianluca Stella, San Gregorio di Catania (IT); Gaetano Pignataro, Trecastagni (IT); Maurizio Maria Ferrara, Catania (IT)

(73) Assignee: STMicroelectronics S.r.l., Agrate Brianza (IT)

(*) Notice: Subject to any disclaimer, the term of this patent is extended or adjusted under 35 U.S.C. 154(b) by 242 days.

(21) Appl. No.: 13/871,861

(22) Filed: Apr. 26, 2013

(65) Prior Publication Data
US 2013/0285230 A1   Oct. 31, 2013

(30) Foreign Application Priority Data

Apr. 27, 2012   (IT) .............................. MI2012A0711

(51) Int. Cl.
| | |
|---|---|
| H01L 23/34 | (2006.01) |
| H01L 25/07 | (2006.01) |
| H01L 23/433 | (2006.01) |
| H01L 23/492 | (2006.01) |
| H01L 23/495 | (2006.01) |

(52) U.S. Cl.
CPC ............ *H01L 23/34* (2013.01); *H01L 23/4334* (2013.01); *H01L 23/492* (2013.01); *H01L 23/49562* (2013.01); *H01L 23/49568* (2013.01); *H01L 23/49575* (2013.01); *H01L 25/074* (2013.01); *H01L 2224/48091* (2013.01); *H01L 2224/48247* (2013.01); *H01L 2924/13055* (2013.01); *H01L 2924/13062* (2013.01); *H01L 2924/13091* (2013.01)

(58) Field of Classification Search
None
See application file for complete search history.

(56) References Cited

U.S. PATENT DOCUMENTS

| | | | |
|---|---|---|---|
| 4,268,850 | A | 5/1981 | Lazarek et al. |
| 6,072,240 | A | 6/2000 | Kimura et al. |
| 6,703,707 | B1 | 3/2004 | Mamitsu et al. |
| 6,919,631 | B1 | 7/2005 | Hoffman et al. |
| 7,564,124 | B2 | 7/2009 | Lee et al. |

(Continued)

FOREIGN PATENT DOCUMENTS

| | | |
|---|---|---|
| JP | 2001156219 A | 6/2001 |
| JP | 2004193476 A | 7/2004 |

(Continued)

*Primary Examiner* — Zandra Smith
*Assistant Examiner* — Molly Reida
(74) *Attorney, Agent, or Firm* — Seed IP Law Group PLLC

(57) ABSTRACT

A power device includes a chip of semiconductor material and a further chip of semiconductor material on each of which at least one power transistor is integrated; each chip comprises a first conduction terminal on a first surface, and a second conduction terminal and a control terminal on a second surface opposite the first surface, and an insulating body embedding said chip and said further chip. In the solution according to one or more embodiments of the present disclosure, the first surface of said chip faces the second surface of said further chip, and the power device further comprises a first heat-sink arranged between said chip and said further chip and electrically coupled with the first conduction terminal of said chip and with the second conduction terminal of said further chip, the control terminal of said further chip being electrically insulated from the first heat-sink.

18 Claims, 7 Drawing Sheets

(56) References Cited

U.S. PATENT DOCUMENTS

| | | |
|---|---|---|
| 2001/0040246 A1 | 11/2001 | Ishii |
| 2002/0024129 A1* | 2/2002 | Hirahara et al. ............. 257/691 |
| 2003/0122232 A1 | 7/2003 | Hirano et al. |
| 2004/0097082 A1 | 5/2004 | Mamitsu et al. |
| 2004/0195649 A1 | 10/2004 | Miura et al. |
| 2005/0056927 A1 | 3/2005 | Teshima et al. |
| 2006/0090102 A1 | 4/2006 | Wehrly, Jr. et al. |
| 2006/0138452 A1 | 6/2006 | Knapp et al. |
| 2007/0075419 A1 | 4/2007 | Fukuda et al. |
| 2007/0216013 A1 | 9/2007 | Funakoshi et al. |
| 2008/0007920 A1 | 1/2008 | Shiraki et al. |
| 2008/0054417 A1 | 3/2008 | Lee et al. |
| 2009/0116197 A1 | 5/2009 | Funakoshi et al. |
| 2009/0302444 A1 | 12/2009 | Ueda et al. |
| 2011/0057713 A1 | 3/2011 | Kawanami et al. |
| 2011/0310565 A1 | 12/2011 | He |
| 2013/0285230 A1 | 10/2013 | Stella et al. |

FOREIGN PATENT DOCUMENTS

| | | |
|---|---|---|
| JP | 2005123233 A | 5/2005 |
| JP | 2008042074 A | 2/2008 |

\* cited by examiner

PACKAGE FOR POWER DEVICE AND METHOD OF MAKING THE SAME

BACKGROUND

1. Technical Field

The present disclosure relates to the electronics field, and more particularly to an electronic device having two power transistors in series within a single power device.

2. Description of the Related Art

Each electronic device typically comprises a chip, for example of semiconductor material, on which one or more electronic components are integrated, and a package wherein the chip is embedded for protecting it and for allowing access to its terminals.

In this regard, the package typically comprises an insulating body having exposed leads, each one of which is electrically connected to a corresponding terminal of the chip (for example, by a wire connection technique or "wire-bonding"). The leads of the package are used for connecting it (and hence the corresponding terminals of the chip) to external circuits. For such purpose, the electronic device is typically mounted on a printed circuit board (PCB) comprising such external circuits. In a typical implementation, based on through-hole technology (or THT), the leads of the package comprise reophores or pins adapted to be inserted into through-holes of the PCB and back-welded on it.

A very widespread class of electronic devices is represented by electronic devices for power applications (e.g., for motors control and power supplies) or power devices, which are able of withstanding high operative currents and/or voltages—for example, of the order of 0.3-300 A and 12-1,500V, respectively.

As it is known, the power devices are subject to considerable heating during their operation. For this reason, they are typically designed and used to ensure adequate heat dissipation properties (so as to avoid overheating phenomena to the corresponding chips that might cause malfunction or breakage). In this regard, each through-hole power device is equipped with a heat-sink connected to the chip for dissipating the heat generated during its operation outwards. For this reason, the heat-sink typically comprises a plate exposed on a side surface of the insulating body free from the leads. Furthermore, in use, such a power device is typically fixed to an outer plate of conductive material (also mounted on the PCB) in contact with the exposed plate (in this way, such plate acts both as a supporting member for the power device and as an external heat-sink). For this purpose, the power device is usually provided with a through-hole for its fixing to the outer plate (for example, by screw or bolt).

As it is known, the power devices are widely used in switching circuits, for example for converting a direct voltage into an alternate voltage. For example, a typical switching circuit, referred to as full-bridge switching circuit, comprises two pairs of power electronic switches (e.g., implemented by vertical structure MOS power transistors) in half-bridge configuration for driving a load differentially; in particular, the power transistors of each pair are arranged in series, i.e., they are connected between a reference terminal, or ground, and a supply terminal (with a common terminal that usually defines a corresponding output terminal), whereas the two pairs of power transistors are arranged in parallel between each other (i.e., they share the ground and supply terminals), with the load connected between the respective output terminals.

The power transistors are typically integrated on separate chips (for both technical and economic reasons), with each chip that is typically embedded within a respective package (thus obtaining the corresponding power device). Therefore, in order to obtain a switching circuit, replicated structures of same power devices (e.g., four in case of full-bridge switching circuit) can be separately mounted on the PCB, and suitably connected to each other according to the desired configuration.

However, the switching circuits of this kind are not satisfactory in terms of area occupation, of constructive complexity and heat dissipation efficiency.

BRIEF SUMMARY

One embodiment of the present disclosure is directed to making two power transistors in series within a single power device.

More specifically, an embodiment of the present disclosure proposes a power device. The power device comprises a chip of semiconductor material and a further chip of semiconductor material on each of which at least one power transistor is integrated; each chip comprises a first conduction terminal on a first surface, and a second conduction terminal and a control terminal on a second surface opposite the first surface, and an insulating body embedding said chip and said further chip. In the one or more embodiments of the present disclosure, the first surface of said chip faces the second surface of said further chip, and the power device further comprises a first heat-sink arranged between said chip and said further chip and electrically coupled with the first conduction terminal of said chip and with the second conduction terminal of said further chip, the control terminal of said further chip being electrically insulated from the first heat-sink.

Another aspect of an embodiment of the present disclosure proposes a complex system comprising one or more of such power devices.

A further aspect of the solution according to an embodiment of the present disclosure proposes a method for making such a power device.

BRIEF DESCRIPTION OF THE SEVERAL VIEWS OF THE DRAWINGS

The embodiments of the disclosure, as well as further features and the advantages thereof, will be best understood with reference to the following detailed description, given purely by way of a non-restrictive indication, to be read in conjunction with the accompanying drawings (wherein, for the sake of ease, corresponding elements are denoted with equal or similar references, and their explanation is not repeated, and the name of each entity is generally used for denoting both type and attributes thereof—such as value, content and representation). In this respect, it is expressly understood that the figures are not necessarily drawn to scale (with some details that may be exaggerated and/or simplified) and that, unless otherwise indicated, they are simply used to conceptually illustrate the described structures and procedures. In particular.

DETAILED DESCRIPTION

Figure 1:
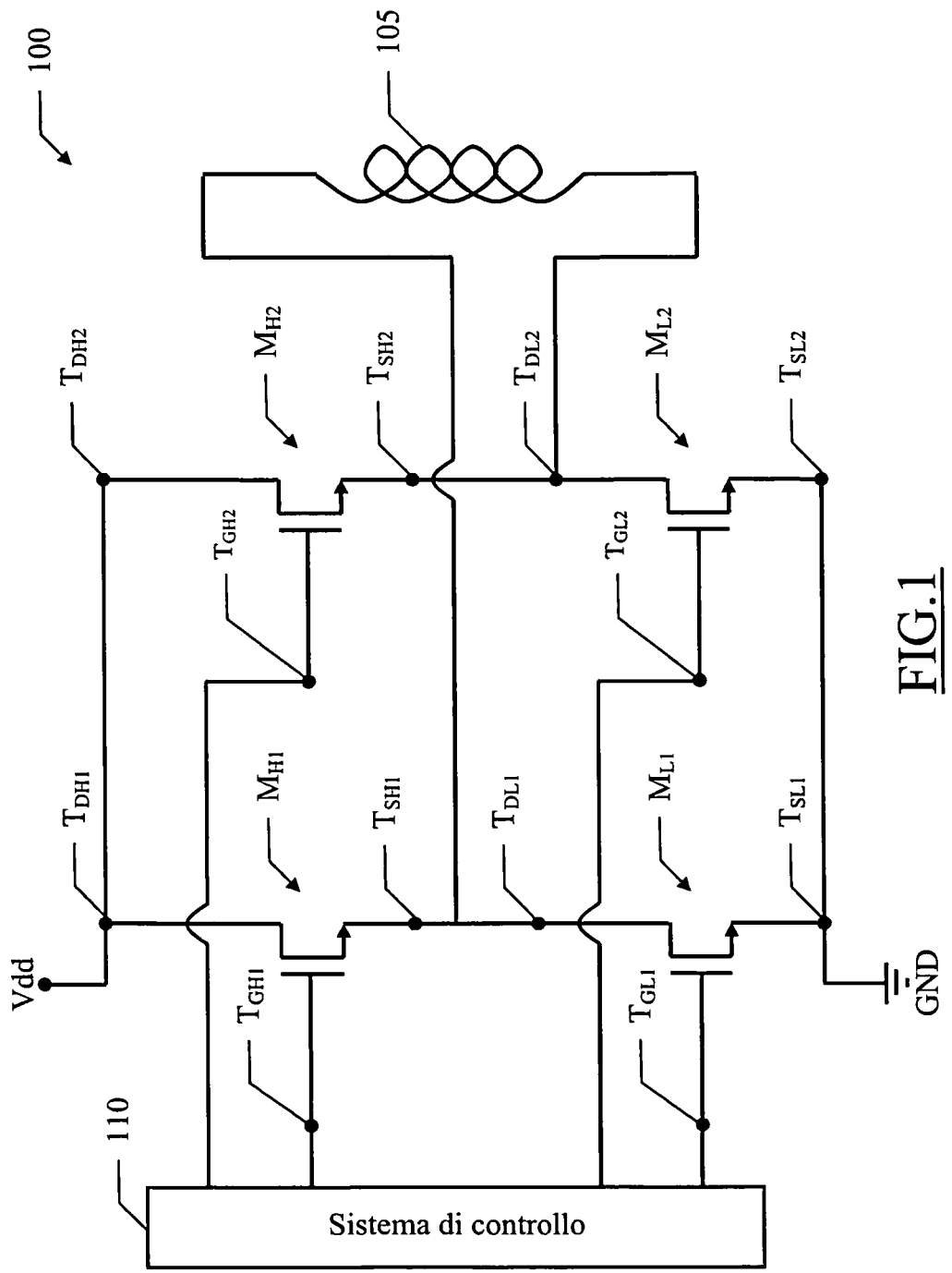
FIG. 1 shows a principle circuit scheme of a switching system wherein an embodiment of the disclosure may be used.

With particular reference to FIG. 1, there is shown a principle circuit scheme of a switching circuit 100 wherein an embodiment of the disclosure may be used.

The switching circuit 100 has a full-bridge structure, and comprises two lower power switches (low-side) $M_{L1}, M_{L2}$ (e.g., N-channel MOS power transistors) and two upper power switches (high-side) $M_{H1}, M_{H2}$ (e.g., also N-channel MOS power transistors). The transistors $M_{L1}, M_{L2}, M_{H1}, M_{H2}$ comprise each one a drain terminal $T_{DL1}, T_{DL2}, T_{DH1}, T_{DH2}$, a source terminal $T_{SL1}, T_{SL2}, T_{SH1}, T_{SH2}$, and a gate terminal $T_{GL1}, T_{GL2}, T_{GH1}, T_{GH2}$, respectively, and are connected to each other in half-bridge configuration.

In such configuration, the source terminal $T_{SL1}, T_{SL2}$ of the transistor $M_{L1}, M_{L2}$ is connected to a ground terminal GND (which receives a reference voltage, or ground), the drain terminal $T_{DH1}, T_{DH2}$ of the transistor $M_{H1}, M_{H2}$ is connected to a supply terminal $V_{DD}$ (which receives a DC supply voltage—for example, 600-900V with respect to the ground voltage), whereas the drain terminal $T_{DL1}, T_{DL2}$ of the transistor $M_{L1}, M_{L2}$ and the source terminal $T_{SH1}, T_{SH2}$ of the transistor $M_{H1}, M_{H2}$ are connected to each other so as to define a corresponding output terminal of the half-bridge $M_{L1}$-$M_{H1}$, $M_{L2}$-$M_{H2}$ (with a—e.g., inductive—load 105 that is connected between such output terminals). Finally, the gate terminals $T_{GL1}, T_{GL2}, T_{GH1}, T_{GH2}$ are connected to a control system 110, which commands the transistors $M_{L1}, M_{L2}, M_{H1}, M_{H2}$ such that each pair formed by the (lower) transistor $M_{L1}, M_{L2}$ of a half-bridge and the (upper) transistor $M_{H1}, M_{H2}$ of the other half-bridge (i.e., the pairs $M_{L1}, M_{H2}$ and $M_{L2}, M_{H1}$) is turned-on and off alternately.

Figure 2:
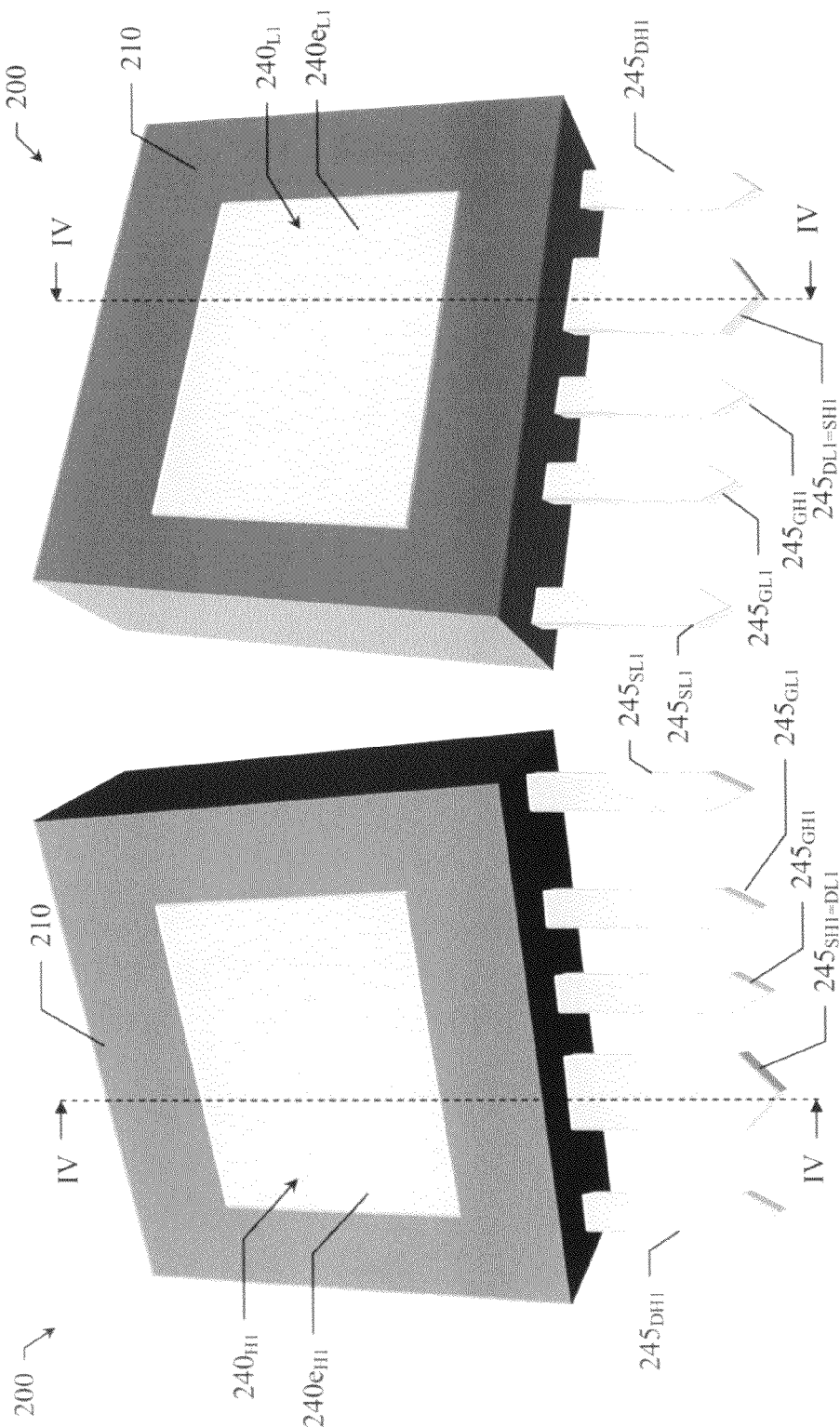
FIGS. 2A and 2B show perspective front and rear views, respectively, of a power device according to an embodiment of the disclosure that may be used for implementing such a switching system.

Turning to FIGS. 2A and 2B, they show perspective front and rear views, respectively, of a power device according to an embodiment of the disclosure that may be used for implementing such switching system. For the sake of description ease, such figures will be discussed jointly with FIG. 3, which shows a perspective view with removed parts of the power device 200, and with FIG. 4, which shows a sectional view of such power device 200 along the section plane IV-IV illustrated in FIGS. 2A and 2B.

According to the present disclosure, the power device 200 implements a half-bridge (the half-bridge $M_{L1}$-$M_{H1}$, in the non-limiting example at issue), i.e., it encloses the lower transistor $M_{L1}$ and the upper transistor $M_{H1}$ connected in series within it.

In this regard, the power device 200 comprises a chip $205_{L1}$ on which the lower transistor $M_{L1}$ is integrated, a further chip $205_{H1}$ on which the upper transistor $M_{H1}$ is integrated, and an insulating body (e.g., of plastic material) 210 for embedding the chips $205_{L1}, 205_{H1}$. In the illustrated embodiment, the transistors $M_{L1}, M_{H1}$ are vertical structure power transistors having high operative currents and/or voltages—for example, of the order of 0.6 A-130 A and 550-650V, respectively.

In such configuration, the drain terminal $T_{DL1}, T_{DH1}$ of the transistor $M_{L1}, M_{H1}$ extends on a surface $215_{aL}, 215_{aH}$ of the chip $205_{L1}, 205_{H1}$, the source terminal $T_{SL1}, T_{SH1}$ of the transistor $M_{L1}, M_{H1}$ extends on another surface $215_{bL}, 215_{bH}$ of the chip $205_{L1}, 205_{H1}$ opposite the surface $215_{aL}, 215_{aH}$, whereas the gate terminal $T_{GL1}, T_{GH1}$ of the transistor $M_{L1}, M_{H1}$ also extends on the surface $215_{bL}, 215_{bH}$ of the chip $205_{L1}, 205_{H1}$, substantially surrounding the terminal $T_{SL1}, T_{SH1}$. More particularly, as best visible in FIG. 3 and in FIG. 4, each gate terminal $T_{GL1}, T_{GH1}$ comprises a perimeter portion 214 (i.e., a frame arranged at the edges of the surface $215_{bL}, 215_{bH}$) and connection pad $216_G, 216_H$.

The configuration of the chips $205_{L1}, 205_{H1}$ within the insulating body 210 is configured to obtain two power transistors in series within the same power device 200 (i.e., with the source terminal $T_{SH1}$ of the transistor $M_{H1}$ electrically coupled with the drain terminal $T_{DL1}$ of the transistor $M_{L1}$).

In this regard, the surface $215_{bH}$ of the chip $205_{H1}$ faces the surface $215_{aL}$ of the chip $205_{L1}$ (i.e., the chips $205_{L1}$ and $205_{H1}$ have the same orientation), with interposition of a heat-sink 220 (for example, a plate of electrically and thermally conductive material) coupled (e.g., connected by a solder paste) with the source terminal $T_{SH1}$ of the transistor $M_{H1}$ and with the drain terminal $T_{DL1}$ of the transistor $M_{L1}$ (in this way, the heat-sink 220 is shared by, and connected to both such terminals, so as to make the series connection with a small area occupation of the power device 200).

According to the present disclosure, the heat-sink 220 is shaped such as to allow the connection thereof to the drain terminal $T_{DL1}$ of the transistor $M_{L1}$ and to the source terminal $T_{SH1}$ of the transistor $M_{H1}$ without contacting the gate terminal $T_{GH1}$ of the latter.

In this regard, the heat-sink 220 has (for example, on a side facing the conductive leads of the power device 200) a side recess 225 extending from an edge of the heat-sink 220 till near the source terminal $T_{SH1}$ (not visible in FIG. 3), and adapted to house the pad $216_H$ of the gate terminal $T_{GH1}$ for allowing the electrical connection thereof. Moreover, a perimeter groove 230, for example having a substantially rectangular cross-section, is provided on the surface of the heat-sink 220 facing the surface $215_{bH}$ of the chip $205_{H1}$, such groove being interrupted by the recess 225. Such groove 230, arranged in a manner substantially corresponding to the frame 214 of the gate terminal $T_{GH1}$, is adapted to house (without contacting) the latter; in this way, the gate terminal $T_{GH1}$ is isolated from the heat-sink 220, and hence from the drain terminal $T_{DL1}$.

Although not shown in the figures, the surface of the heat-sink 220 facing the surface $215_{aL}$ of the chip $205_{L1}$ may comprise a hollow adapted to house, with contact, the drain terminal $T_{DL1}$ of the transistor $M_{L1}$. It should be noted that, such device is advantageous as it may help to further reduce the size of the power device 200. Anyway, as will be understood, the depth of the hollow (as well as the shape of the insulating body 210) will be suitably chosen such as to ensure of meeting the safety parameters of the power device 200 (e.g., creepage distance and clearance distance).

According to the present disclosure, the power device 200 comprises another heat-sink $235_{H1}$ electrically coupled with the drain terminal $T_{DH1}$ of the transistor $M_{H1}$ and a further heat-sink $235_{L1}$ (for example, similar to the heat-sink $235_{H1}$) electrically coupled with the source terminal $T_{SL1}$ of the transistor $M_{L1}$. In this way, the heat-sinks $235_{L1}, 235_{H1}$ are arranged laterally, opposite to each other, with respect to a mounting direction of the power device 200.

Figure 3:
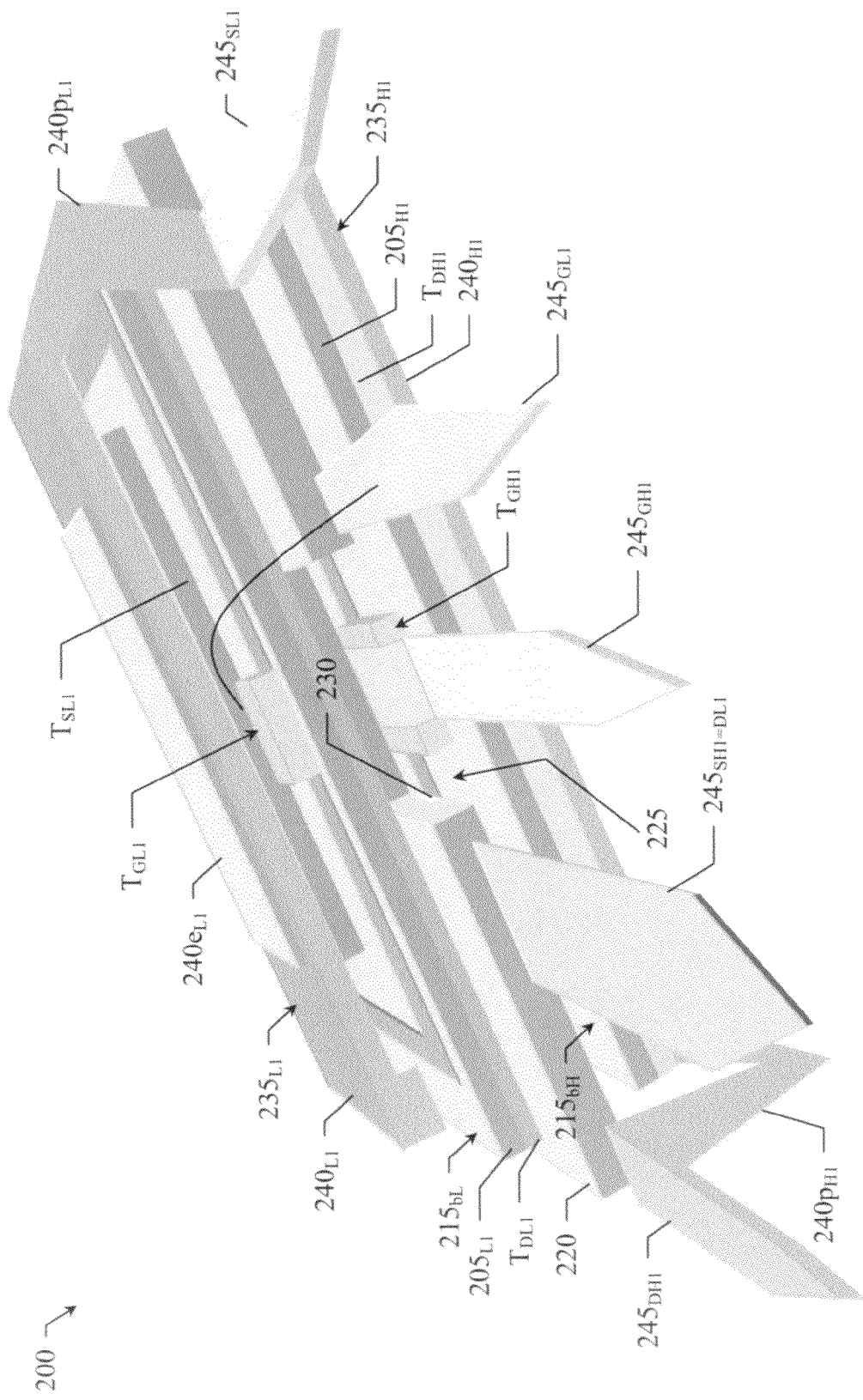
FIG. 3 shows a perspective view with removed parts of the power device of FIGS. 2A and 2B.
Figure 4:
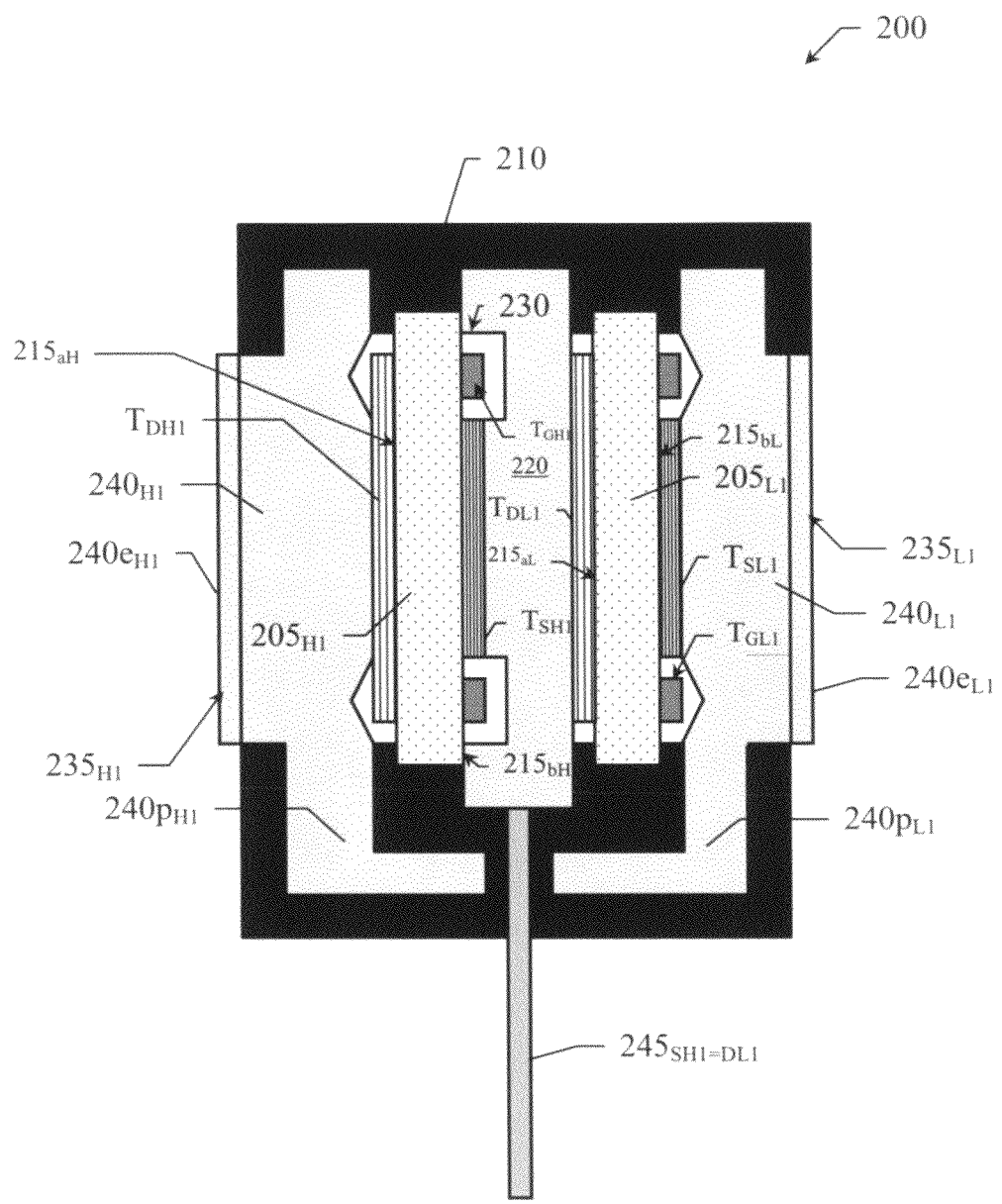
FIG. 4 shows a sectional view of the power device along the section plane IV-IV of FIGS. 2A and 2B.

Each heat-sink $235_{L1}, 235_{H1}$ comprises a dissipation member $240_{L1}, 240_{H1}$ facing the surface $215_{bL}, 215_{aH}$ of the chip $205_{L1}, 205_{H1}$. The dissipation member $240_{H1}, 240_{L1}$, for example also comprising a plate of (electrically and thermally) conductive material, contacts, respectively, the drain terminal $T_{DH1}$ of the transistor $M_{H1}$ and the source terminal $T_{SL1}$ of the transistor $M_{L1}$ (for example, totally, as shown in the figures, or partly). The dissipation member $240_{L1}$ extends over at least one portion of the gate terminal $T_{GL1}$ of the transistor $M_{L1}$ (for example, over two opposite portions of its frame, as shown in FIG. 3 and in FIG. 4) without contact it; for such purpose, the dissipation member $240_{L1}$ comprises one or more hollows $218_L$, $218_H$—two in the example at issue—for electrically isolating the gate terminal $T_{GL1}$ of the dissipation member $240_{L1}$. In the illustrated embodiment, also the dissipation member $240_{H1}$ is provided with the same hollows $218_H$; it should be noted that, as the gate terminal $T_{GH1}$, being on the surface $215_{bH}$, is already isolated from the dissipation member $240_{H1}$, this device is advantageous as it ensures a construction symmetry of the power device 200.

The power device 200 further comprises five conductive leads $245_{DH1}$, $245_{SH1=DL1}$, $245_{GH1}$, $245_{GL1}$, $245_{SL1}$ exposed from the insulating body 210, which are connected to respective terminals of the chips (for making them accessible from the outside of the power device 200) and are suitable to allow the mounting of the power device 200 on a circuit board (PCB), not shown, by through-hole technology (or THT).

More particularly, the conductive lead $245_{SH1=DL1}$ is monolithic with the heat-sink 220, thus resulting in electrical and thermal contact with the terminals $T_{SH1}$, $T_{DL1}$ in an optimal manner. In this way, the conductive lead $245_{SH1=DL1}$ may act both as access lead for accessing the terminals $T_{SH1}$, $T_{DL1}$, and as extension of the heat-sink 220 for better dissipating the heat to the outside of the insulating body 210; for such purpose, the conductive lead $245_{SH1=DL1}$ is advantageously provided (as also illustrated in the figures) of a surface exposed from the insulating body 210 greater than the (standard one) of the conductive leads $245_{DH1}$, $245_{GH1}$, $245_{GL1}$, $245_{SL1}$; for example, the area of the exposed surface of the conductive lead $245_{SH1=DL1}$ is equal to 1.5-3 times, preferably equal to 1.7-2.5 times, as equal to 2 times the area of the exposed surface of the conductive leads $245_{DH1}$, $245_{GH1}$, $245_{GL1}$, $245_{SL1}$. Anyway, as will be understood, such device is not limiting for the present disclosure, and may also be omitted, replaced by or associated with various technical solutions for increasing the heat dissipation properties of the heat-sink 220; for such purpose, in an exemplary embodiment (not shown), the heat-sink 220 may extend, from the side opposite to that of the conductive lead $245_{SH1=DL1}$, beyond the insulating body 210.

In the illustrated embodiment, the conductive lead $245_{DH1}$, $245_{SL1}$ contacts the heat-sink $235_{H1}$, $235_{L1}$ directly. In this way, the conductive lead $245_{DH1}$, $245_{SL1}$ contacts the terminals $T_{DH1}$, $T_{SL1}$ through the heat-sink $235_{H1}$, $235_{L1}$, and hence without using wire connections, or wire bonding (which would introduce resistive and/or inductive parasitism that may adversely affect a driving of the power device 200, for example by causing long switching times and high switching losses). In this regard, each dissipation member $240_{L1}$, $240_{H1}$ comprises a member $240p_{L1}$, $240p_{H1}$ protruding (beyond an edge of the chip $205_{L1}$, $205_{H1}$) for directly contacting the conductive lead $245_{SL1}$, $245_{DH1}$, respectively (with such contacting that may be obtained by folding the protruding member $240p_{L1}$, $240p_{H1}$ transversely to the respective chip towards the conductive lead $245_{SL1}$, $245_{DH1}$, as shown in the figures by way of non limiting example, or by folding the conductive lead $245_{SL1}$, $245_{DH1}$ towards the protruding member $240p_{L1}$, $240p_{H1}$, or both of them). Anyway, as the mutual orientation of the chips may be chosen according to specific design parameters, it is not excluded that in some implementations it might be easier and more convenient to connect the conductive lead $245_{SL1}$, the conductive lead $245_{DH1}$, or both of them, to respective heat-sink $235_{L1}$, $235_{H1}$ by wire bonding (and in such case the protruding member $240p_{L1}$, $240p_{H1}$ may be omitted).

The conductive lead $245_{GL1}$ is electrically connected to the connection pad of the terminal $T_{GL1}$ within the insulating body 210 by wire bonding. In fact, it should be noted that, in the described configuration, the connection pad of the gate terminal $T_{GL1}$ is quite close to the conductive lead $245_{GL1}$ (so that the parasitic effects introduced by wire bonding are negligible).

Finally, the conductive lead $245_{GH1}$ extends (with a prolongation thereof within the insulating body 210) into the recess 225, in contact with the pad of the gate terminal $T_{GH1}$.

Therefore, in the described embodiment, the conductive leads $245_{DH1}$, $245_{SH1=DL1}$, $245_{GH1}$, $245_{GL1}$, $245_{SL1}$ are electrically coupled with the terminals $T_{DH1}$, $T_{SH1}$-$T_{DL1}$, $T_{GH1}$, $T_{GL1}$, $T_{SL1}$, respectively; in this way, the transistors $M_{L1}$, $M_{H1}$ integrated on the corresponding chips $205_{L1}$, $205_{H1}$ are connected in series with each other.

Such solution is advantageous in that the power device 200, as implementing a semi-bridge, may be used in switching circuits with very small area occupations compared with the known solutions, wherein replicated structures of same power devices mounted separately on the PCB are instead used.

Finally, the power device 200 according to an embodiment of the present disclosure also comprises one or more portions of conductive material exposed from the insulating body 210 for dissipating the heat to the outside thereof. In the exemplary illustrated embodiment, the power device 200 is of the DSC ("Dual Side Cool") type, i.e., it has two different portions exposed from the insulating body 210; more particularly, the heat-sink $235_{L1}$ comprises an exposed portion $240e_{L1}$ (of the dissipation member $240_{L1}$) distal from the chip $205_{L1}$, whereas the heat-sink $235_{H1}$ comprises an exposed portion $240e_{H1}$ (of the dissipation member $240_{H1}$) distal from the chip $205_{H1}$ (with such exposed portions $235e_{L1}$, $235e_{H1}$ that are thus exposed on opposite side surfaces of the insulating body 210 orthogonal to a mounting direction of the power device 200 on the PCB).

Such solution is advantageous as it provides high heat dissipation properties; in this way, the power device 200 does not necessarily require the use of the auxiliary dissipation plate (or external plate) that, in the known solutions, is mounted on the PCB in contact with the power device, nor of the through-holes through the insulating body 210 for the fixing thereto (with consequent further size reduction of the power device 200). Therefore, the power device 200 is remarkably compact and easy to make.

It should be noted that the described solution lends itself to be equipped with devices to further improve the heat dissipation properties in a simple and fast way (e.g., insulating rings adapted to clamp one or more external plates on the exposed portion $240e_{H1}$, on the exposed portion $240e_{H1}$, or on both of them).

Figure 5:
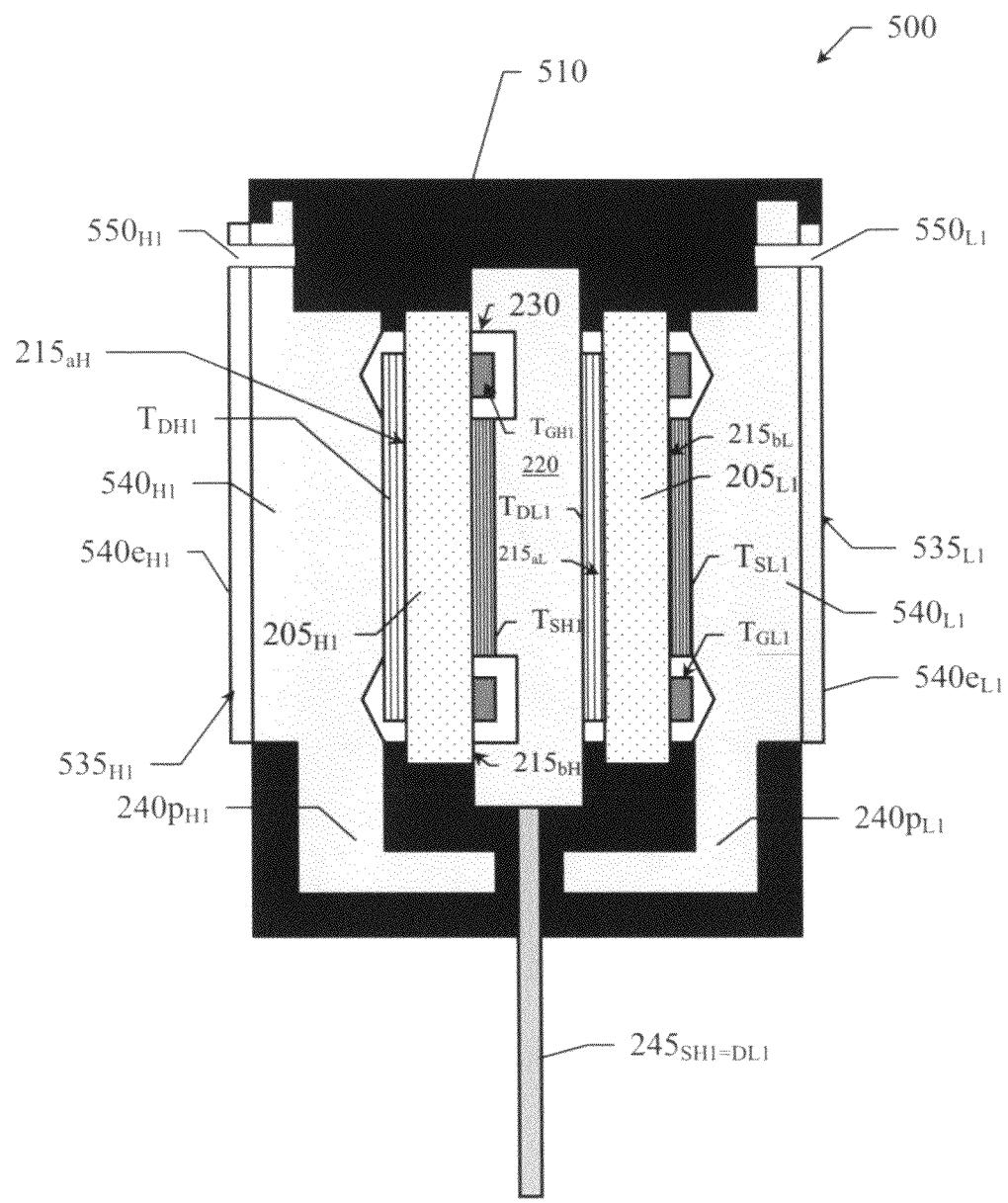
FIG. 5 shows, in a view similar to that of FIG. 4, a power device according to another embodiment of the disclosure.

Anyway, the possibility of applying such external plates by screwing is not excluded by the present disclosure; as will be understood, in basic embodiments, this may be achieved with few and simple changes to the power device of above. In this regard, reference will be made now to FIG. 5 showing, in a view similar to that of FIG. 4, a power device 500 according to another embodiment of the disclosure. The power device 500 is similar to the previous one, but, unlike the latter, each heat-sink $535_{L1}$, $535_{H1}$ comprises a hole $550_{L1}$, $550_{H1}$ for receiving a respective fixing screw (or bolt, not shown) for tightening, thereby making it integral, each external plate to a respective heat-sink $535_{L1}$, $535_{H1}$ (and hence to the power device 500). In order to achieve this, as visible in the figure, the dissipation member $540_{L1}, 540_{H1}$ and the respective exposed portion $540e_{L1}, 540e_{H1}$ of the heat-sink $535_{L1}, 535_{H1}$ (and, correspondingly, the insulating body 510 as well) have, in the direction opposite the mounting direction, larger size than the previous ones. As will be understood, such a size increase is not predictable a priori (as it may depend on the design parameters), but in any case it will be sufficient to make the holes $550_{L1}, 550_{H1}$ while observing the creepage and clearance distances.

It should be noted that, although in the figure each hole $550_{L1}, 550_{H1}$ has been shown as passing completely through the dissipation member $540_{L1}, 540_{H1}$ and the respective exposed portion $540e_{L1}, 540e_{H1}$, this should not to be understood restrictively; in embodiments, not illustrated, each hole $550_{L1}, 550_{H1}$ may pass through the dissipation member $540_{L1}, 540_{H1}$ only partially.

Figures 6A, 6B:
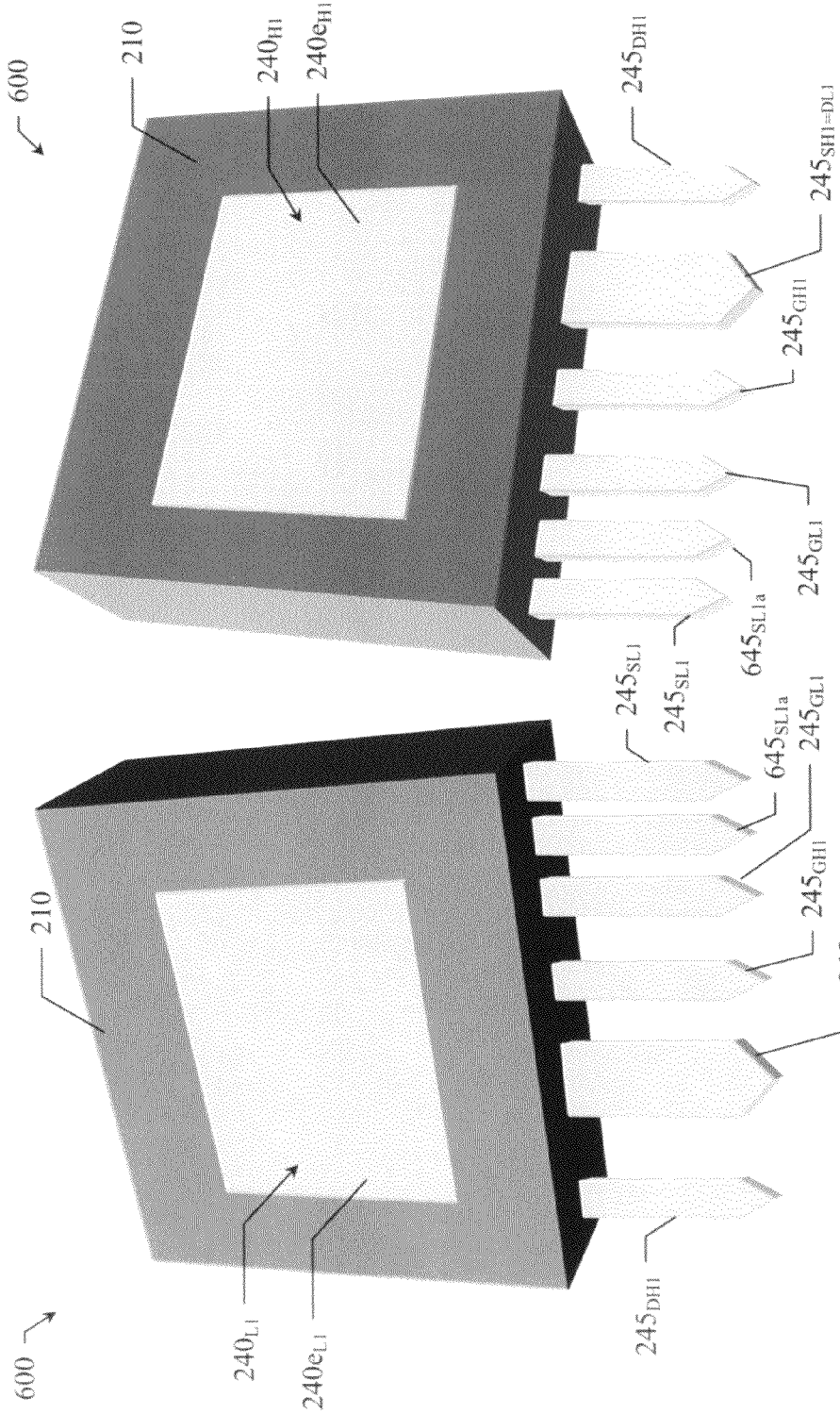
FIGS. 6A and 6B show perspective front and rear views, respectively, of a power device according to a further embodiment of the disclosure.
Figure 7:
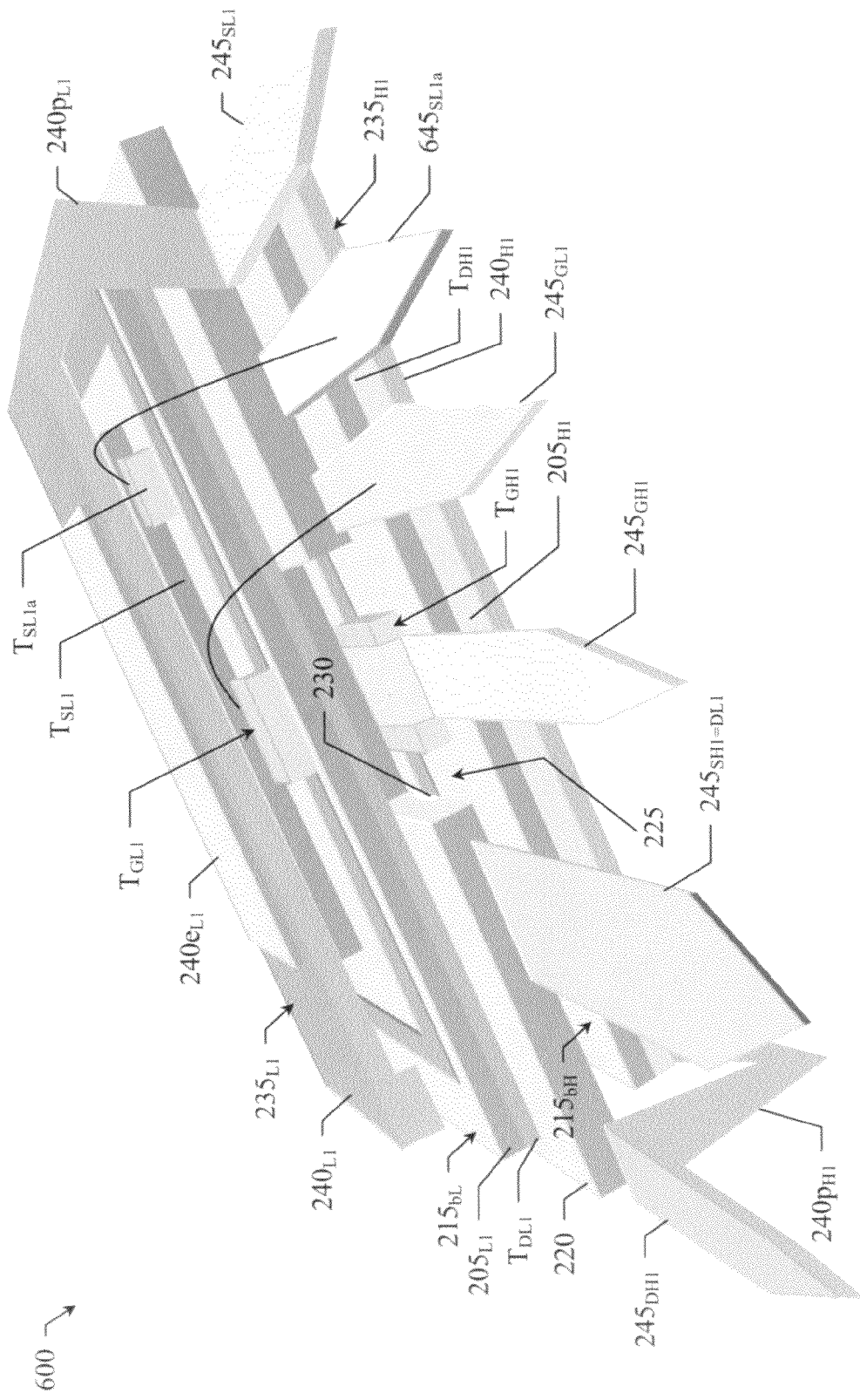
FIG. 7 shows a perspective view with removed parts of the power device of FIGS. 6A and 6B.

Turning to FIGS. 6A and 6B, they show perspective front and rear views, respectively, of a power device 600 according to another embodiment of the disclosure. For the sake of description ease, such figures will be discussed jointly with FIG. 7, which shows a perspective view with removed parts of the power device 600.

The power device 600 is similar to the power device 200, but differs from the latter for the presence of an auxiliary source terminal $T_{SL1a}$ arranged on the surface $215_{bL}$ of the chip $205_{L1}$, within the frame of the gate terminal $T_{GL1}$ (separated from the latter and from the source terminal $T_{SL1}$).

As it is known, the auxiliary source terminal $T_{SL1a}$ may be used, for example, to provide differentiated conductive paths for control signals and power signals (i.e., the operative voltages and/or currents) induced by them.

In this regard, the power device 600 further comprises an auxiliary conductive lead $645_{SL1a}$ electrically coupled with the terminal $T_{SL1a}$. In the illustrated exemplary embodiment, the conductive lead $645_{SL1a}$ is electrically connected to the terminal $T_{SL1a}$ by wire bonding (although this should not be construed limitatively for the present disclosure).

The power device 600 is further advantageous with respect to that of the previous embodiment in that it has reduced power losses and lower operating temperatures, and hence greater durability and reliability.

Naturally, in order to satisfy local and specific requirements, a person skilled in the art may apply to the solution described above many logical and/or physical modifications and alterations. More specifically, although this solution has been described with a certain degree of particularity with reference to one or more embodiments thereof, it should be understood that various omissions, substitutions and changes in the form and details as well as other embodiments are possible. Particularly, different embodiments of the disclosure may even be practiced without the specific details (such as the numerical examples) set forth in the preceding description to provide a more thorough understanding thereof; conversely, well-known features may have been omitted or simplified in order not to obscure the description with unnecessary particulars. Moreover, it is expressly intended that specific elements and/or method steps described in connection with any embodiment of the disclosed solution may be incorporated in any other embodiment as a matter of general design choice. In any case, ordinal qualifiers or the like are merely used as labels for distinguishing elements with the same name but do not connote any priority, precedence or order. Moreover, the terms including, comprising, having and containing (and any of their forms) should be understood with an open and non-exhaustive meaning (i.e., not limited to the recited elements), the terms based on, dependent on, according to, function of (and any of their forms) should be understood as a non-exclusive relationship (i.e., with possible further variables involved) and the term a should be understood as one or more elements (unless expressly stated otherwise).

For example, similar considerations apply if the power device has a different structure or comprises equivalent components. In any case, any of its components may be separated into several elements, or two or more components may be combined into a single element; in addition, each component may be replicated to support the execution of the corresponding operations in parallel. It should also be noted that (unless stated otherwise) any interaction between different components generally does not have to be continuous, and it may be direct or indirect via one or more intermediaries.

For example, number and type of chips is not limitative for the present disclosure, as well as number and type of transistors in each of them. In this regard, the lower transistor and the upper transistor may be replaced by any other equivalent element adapted to operate as an electronic switch (e.g., P-channel MOSFET, IGBT, BJT, or JFET transistors). Moreover, although in description explicit reference has been made to specific operative voltages and/or currents, they should not be understood in a restrictive way. For example, the same considerations apply for power devices that, thanks to more accurate, reliable and evolved production processes, allow obtaining operative voltages and/or currents even greater than the current ones (and hence exceeding 1,500V and 300 A, respectively).

Moreover, the illustrated shape of the insulating body should not be construed limitatively for the present disclosure, as well as type of materials and production process that may be employed for its making.

Although the gate terminal has been described as extending around the source terminal, this does not mean that this is the only possible way to make it. In this regard, the gate terminal may comprise conductive fingers, for example extending inwardly towards the source terminal and kept electrically separated from it by a suitable insulating material (with further hollows that may be provided for housing at least part of such gate fingers).

The side recess of the heat-sink may have different shape and/or extension; in any case, the possibility of making such a heat-sink with a shape (for example, L-shaped) extending only at the source terminal of the upper transistor (while leaving free its gate terminal) is not excluded. Moreover, although the side recess has been illustrated in the figures as extending through the opposite surfaces of the shared heat-sink, this should not be understood restrictively; for example, it is possible to provide a recess extending, starting from the surface of such heat-sink, for a reduced height of the same (but in any case sufficient to house the connection pad and optionally the respective conductive lead).

Moreover, the groove formed on such a heat-sink (for insulating the gate terminal of the upper transistor from it) may have any other shape and/or size (according to the shape of the gate terminal of the upper transistor); in any case, such groove may also be omitted when the gate terminal of the upper transistor has such a structure to be already isolated from the heat-sink (for example, whether formed only by the connection pad). In addition, the inner walls of the groove may comprise insulating layers.

The side heat-sinks may be of any type, shape and size, and in any position and number. Furthermore, such heat-sinks may be electrically coupled with the respective terminals in any way. In particular, they may also be not in direct contact with (the respective terminal of) the chip; for example, intermediate layers (e.g., coupling and/or sealing layers) may be provided in order to ensure good adhesion properties (and hence efficient mechanical and/or electrical coupling). For the same reasons, each one of such intermediate layers may comprise respective multi-layer structures.

Moreover, the exposed portion may face any other free surface of the insulating body. Such exposed portion may be at the level of the insulating body, protruding from the same, or even slightly recessed.

The number of conductive leads is not limitative for the present disclosure, as well as their connections to the terminals of the chips (with any combination thereof that is possible). Moreover, the present disclosure may be applied to any shape and size of the conductive leads (for example, with all the conductive leads that may have the same exposed surface). In addition, in a basic implementation, the conductive lead related to the output terminal may be connected (e.g., welded) to the heat-sink (for example, in the embedding process of the chips), rather than being monolithic with it.

It should be readily understood that the proposed structure may be part of the design of an integrated circuit. The design may also be created in a programming language; moreover, if the designer does not manufacture the electronic devices or the masks, the design may be transmitted by physical means to others. In any case, the resulting integrated circuit may be distributed by its manufacturer in raw wafer form, as a bare die, or in packages. Moreover, the proposed structure may be integrated with other circuits in the same chip, or it may be mounted in intermediate products (such as mother boards) and coupled with one or more other chips (such as a processor). In any case, the integrated circuit is suitable to be used in complex systems (such as automotive applications or microcontrollers).

The power device described above lends itself to be used in any other switching system. Similarly, the switching system (comprising any number of such power devices) lends itself to be used in any other complex system—for example, a power supply, a converter, an inverter or a power generator. In any case, the power device may be used in any other application, and it may obviously be made and marketed as a stand-alone product.

Finally, an embodiment of the disclosure lends itself to be implemented through an equivalent method (by using similar steps, removing some non-essential steps, or adding additional optional steps); moreover, the steps may be performed in a different order, in parallel or overlapped (at least in part).

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:
1. A power device, comprising:
    a first chip and a second chip each of semiconductor material, each of the first and second chips including:
        first and second surfaces opposite to each other;
        a power transistor;
        a first conduction terminal on the first surface;
        a second conduction terminal; and
        a control terminal on the second surface, the first surface of said first chip faces the second surface of said second chip; and
    an insulating body configured to encase said first and second chips;
    a first heat-sink arranged between said first chip and said second chip and electrically coupled with the first conduction terminal of said first chip and with the second conduction terminal of said second chip, the control terminal of said second chip being electrically insulated from the first heat-sink; and
    wherein the control terminal of each one of said first chip and second chip comprises a perimeter portion surrounding at least in part the second conduction terminal of the first chip and the second chips, and a connection portion configured to electrically couple the control terminal of the first and second chip to the perimeter portions of the first and second chips, respectively.

2. The power device according to claim 1, further comprising a second heat-sink electrically coupled with the second conduction terminal of said first chip, and a third heat-sink electrically coupled with the first conduction terminal of said second chip, at least one of said first heat-sink and said second heat-sink including an exposed portion exposed from the insulating body.

3. The power device according to claim 2 wherein said second heat-sink and said third heat-sink further comprise a first and a second dissipation member, respectively, the first dissipation member facing the second surface of said first chip and the second dissipation member facing the first surface of said second chip, said exposed portion including a first exposed portion of the first dissipation member distal from said first chip and a second exposed portion of the second dissipation member distal from said second chip.

4. The power device according to claim 3 wherein the first dissipation member facing the second surface of said first chip extends over at least part of the perimeter portion of the control terminal and comprises at least one hollow for electrically insulating said part of the perimeter portion of the control terminal from the first dissipation member.

5. The power device according claim 3, further comprising a plurality of conductive leads exposed from the insulating body and configured to through-hole mount the power device on an electronic board, said conductive leads including:
    a first conductive lead electrically coupled with the first heat-sink;
    a second conductive lead electrically coupled with the second heat-sink;
    a third conductive lead electrically coupled with the third heat-sink;
    a first control conductive lead electrically coupled with the connection pad of the control terminal of said first chip; and
    a second control conductive lead electrically coupled with the connection pad of the control terminal of said second chip.

6. The power device according to claim 5 wherein the first conductive lead has a first surface exposed from the insulating body, and the second conductive lead, the third conductive lead, the first control conductive lead and the second control conductive lead each have a second surface exposed from the insulating body, the first exposed surface being greater than the second exposed surface, and wherein the first conductive lead is monolithic with the first heat-sink.

7. The power device according to claim 6, further comprising:
    a first member configured to transversely protrude from the first dissipation member, and a second member configured to transversely protrude from the second dissipation member, the second conductive lead and the third conductive lead directly contacting the first member and the second member, respectively; and wire connections configured to electrically couple the first control conductive lead to the connection pad of the first control terminal of said first chip, the second control conductive lead being configured to directly contact the connection pad of the control terminal of said second chip.

8. The power device according to claim 5 wherein said first chip comprises an auxiliary conduction terminal on the second surface, and wherein the power device comprises an auxiliary conductive lead and further wire connections configured to electrically couple the auxiliary conductive lead to said auxiliary conduction terminal.

9. A power device, comprising:
a first chip and a second chip each of semiconductor material, each of the first and second chips including:
first and second surfaces opposite to each other;
a power transistor;
a first conduction terminal on the first surface;
a second conduction terminal; and
a control terminal on the second surface, the first surface of said first chip faces the second surface of said second chip;
an insulating body configured to encase said first and second chips; and
a first heat-sink arranged between said first chip and said second chip and electrically coupled with the first conduction terminal of said first chip and with the second conduction terminal of said second chip, the control terminal of said second chip being electrically insulated from the first heat-sink;
wherein the control terminal of each one of said first chip and second chip comprises a perimeter portion surrounding at least in part the second conduction terminal of the first chip and the second chip, and a connection portion configured to electrically couple the control terminal of the first and second chip to the perimeter portions of the first and second chips, respectively; and
wherein the first heat-sink includes:
a recess extending from an edge of the first heat-sink and facing, in use, a mounting surface of the power device, said recess being configured to house, without electrically contacting, the connection portion of the control terminal of said second chip, and
a surface facing the second surface of said second chip and including a perimeter groove configured to house, without electrically contacting, the perimeter portion of the control terminal of said second chip.

10. The power device according to claim 9, further comprising a second heat-sink electrically coupled with the second conduction terminal of said first chip, and a third heat-sink electrically coupled with the first conduction terminal of said second chip, at least one of said first heat-sink and said second heat-sink including an exposed portion exposed from the insulating body.

11. The power device according to claim 10 wherein said second heat-sink and said third heat-sink further comprise a first and a second dissipation member, respectively, the first dissipation member facing the second surface of said first chip and the second dissipation member facing the first surface of said second chip, said exposed portion including a first exposed portion of the first dissipation member distal from said first chip and a second exposed portion of the second dissipation member distal from said second chip.

12. The power device according to claim 11 wherein the first dissipation member facing the second surface of said first chip extends over at least part of the perimeter portion of the control terminal and comprises at least one hollow for electrically insulating said part of the perimeter portion of the control terminal from the first dissipation member.

13. A method, comprising:
making a power device, the making of the power device including:
positioning a first chip of semiconductor material adjacent to a second chip of semiconductor material, each of the first and second chips including a power transistor, first and second surfaces opposite to each other, a first conduction terminal on the first surface, a second conduction terminal, and a control terminal on the second surface; and
encapsulating said first chip and said second chip within an insulating body;
positioning the first surface of said first chip towards the second surface of said second chip;
arranging a first heat-sink between said first chip and said second chip and electrically coupling the first heat sink with the first conduction terminal of said first chip and with the second conduction terminal of said second chip, the control terminal of said second chip being electrically insulated from the first heat-sink; and
coupling a perimeter portion on each of the first and second chip to a connection portion of the control terminal on each of the first and second chip, the perimeter configured to surround a part of the second conduction terminal on each of the first and second chip.

14. The method of claim 13, further comprising positioning the connection portion for each of the first and second chip in a recess extending from an edge of the first heat-sink and facing, in use, a mounting surface of the power device.

15. A device, comprising:
a package that includes:
a first die positioned in the package, the first die including a first power transistor;
a second die positioned in the package, the second die including a second power transistor;
a first heat sink positioned between the first die and the second die in the package, the first heat sink including a groove configured to receive a control terminal of the first transistor and surrounding at least in part a conduction terminal of the first transistor;
a second heat sink having a first portion adjacent to the first die and a second portion adjacent to the second die, the first die, the first heat sink, and the second die being between the first portion and the second portion of the second heat sink, the second heat sink being positioned in the package, the second heat sink including a groove configured to receive a control terminal of the second transistor and surrounding at least in part a conduction terminal of the second transistor.

16. The device of claim 15 wherein the second heat sink includes a first external surface that is exposed through the package on a first side of the package and a second external surface that is exposed through the package on a second side of the package.

17. The device of claim 15, further comprising first and second conductive leads extending from the package, the first conductive lead being coupled to the first heat sink and the second conductive lead is coupled to the second heat sink.

18. The device of claim 17 wherein the first and second conductive leads extend from a single end of the package.

* * * * *